(12) United States Patent
Gardner et al.

(10) Patent No.: US 9,634,181 B2
(45) Date of Patent: Apr. 25, 2017

(54) METHOD OF FORMING A COMPOSITE SUBSTRATE

(75) Inventors: Nathan Frederick Gardner, Sunnyvale, CA (US); Melvin Barker McLaurin, San Jose, CA (US); Michael Jason Grundmann, Sunnyvale, CA (US); Werner Goetz, Palo Alto, CA (US); John Edward Epler, San Jose, CA (US); Qi Ye, Freemont, CA (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 318 days.

(21) Appl. No.: 13/877,549

(22) PCT Filed: Oct. 26, 2011

(86) PCT No.: PCT/IB2011/054770
§ 371 (c)(1),
(2), (4) Date: Apr. 3, 2013

(87) PCT Pub. No.: WO2012/059844
PCT Pub. Date: May 10, 2012

(65) Prior Publication Data
US 2013/0244364 A1    Sep. 19, 2013

Related U.S. Application Data

(60) Provisional application No. 61/409,153, filed on Nov. 2, 2010.

(51) Int. Cl.
*H01L 21/00* (2006.01)
*H01L 33/00* (2010.01)
(Continued)

(52) U.S. Cl.
CPC ........ *H01L 33/0075* (2013.01); *C30B 23/025* (2013.01); *C30B 25/183* (2013.01);
(Continued)

(58) Field of Classification Search
CPC . C30B 23/025; C30B 29/403; H01L 33/0075; H01L 33/00
(Continued)

(56) References Cited

U.S. PATENT DOCUMENTS

2007/0072324 A1* 3/2007 Krames et al. ............... 438/46
2007/0298529 A1* 12/2007 Maeda et al. ................. 438/33
(Continued)

OTHER PUBLICATIONS

"Luminescence Characteristics of N-Polar GaN and InGaN Films Grown by Metal Organic Chemical Vapor Deposition", Japanese Journal of Applied Physics 48, 071003 (2009).
(Continued)

*Primary Examiner* — Charles Garber
*Assistant Examiner* — Abdulfattah Mustapha

(57) ABSTRACT

In a method according to embodiments of the invention, a III-nitride layer is grown on a growth substrate. The III-nitride layer is connected to a host substrate. The growth substrate is removed. The growth substrate is a non-III-nitride material. The growth substrate has an in-plane lattice constant a substrate. The III-nitride layer has a bulk lattice constant a layer. In some embodiments, $[(|a^{substrate} - a^{layer}|)/a^{substrate}]*100\%$ is no more than 1%.

18 Claims, 2 Drawing Sheets

(51) Int. Cl.
*C30B 23/02* (2006.01)
*C30B 25/18* (2006.01)
*C30B 29/40* (2006.01)
*C30B 33/06* (2006.01)

(52) U.S. Cl.
CPC ............ *C30B 29/403* (2013.01); *C30B 33/06* (2013.01); *H01L 2924/0002* (2013.01)

(58) Field of Classification Search
USPC .... 438/33, 46, 47, 462–497; 257/40, 76–79, 257/98, 99, 104, 189–201, E21.133, 257/E21.568, E21.569, E33.028, E21.088, 257/E29.089, E33.023, E33.068
See application file for complete search history.

(56) References Cited

U.S. PATENT DOCUMENTS

2010/0148179 A1* 6/2010 Maruyama et al. ............ 257/59
2010/0244196 A1* 9/2010 Yoshida ........................ 257/615
2010/0260224 A1* 10/2010 Yoshizumi et al. ............ 257/76

OTHER PUBLICATIONS

"Structural Classification of RAO3(MO)n Compounds (R=Sc, In, Y, or Lanthanides; A=Fe(III), Ga, Cr, or Al; M=Divalent Cation; n=1-11)", Kimizuka et al, Journal of Solid State Chemistry 78, 98 (1989).
"Dry and Wet Etching of ScAlMgO4" Solid State Electronics vol. 42, No. 3, pp. 467-469.

* cited by examiner

METHOD OF FORMING A COMPOSITE SUBSTRATE

BACKGROUND

Field of Invention

The present invention relates to a method of forming a composite substrate. A semiconductor light emitting device such as a III-nitride light emitting device may be grown on the composite substrate.

Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

FIG. 1 illustrates a composite substrate for growing a III-nitride structure, described in more detail in US 2007/0072324, which is incorporated herein by reference. Substrate 10 includes a host substrate 12, a seed layer 16, and a bonding layer 14 that bonds host 12 to seed 16. Host layer 12 may be, for example, sapphire or Si and bonding layer 14 may be, for example, $SiO_x$ or $SiN_x$. Seed layer 16 may be, for example, an InGaN layer grown strained on a conventional substrate such as sapphire, then bonded to a host 12 and released during the process from the growth substrate such that the InGaN seed layer at least partially relaxes. Providing the seed layer as stripes or a grid over bonding layer 14, rather than as a single interrupted layer, may result in further strain relief. For example, seed layer 16 may be formed as a single uninterrupted layer, then removed in places, for example by forming trenches, to provide strain relief.

III-nitride seed layer materials may require additional bonding steps in order to form a composite substrate with a III-nitride seed layer in a desired orientation. Wurtzite III-nitride layers grown on c-plane sapphire or c-plane SiC growth substrates are typically grown with a c-plane orientation; e.g. the so-called "c-planes" of the III-nitride layers and the substrates are parallel to each other. Such c-plane wurtzite III-nitride structures have a gallium face and a nitrogen face. III-nitrides are well known to grow with the highest crystalline quality (as measured by luminescence efficiency) when the top surface of the grown layer is the group-III face, often referred to for economy of language as the "gallium face" or "Ga-face," even though it need not include gallium. The bottom surface (the surface adjacent to the growth substrate) is the nitrogen face or "N-face". For example, Masui, et al. describe in "Luminescence Characteristics of N-Polar GaN and InGaN Films Grown by Metal Organic Chemical Vapor Deposition", Japanese Journal of Applied Physics 48, 071003 (2009) that the luminescence efficiency of N-face InGaN films grown by metal-organic chemical vapor deposition (MOCVD) is less than the luminescence efficiency of Ga-face InGaN films grown by MOCVD. Simply growing seed layer material conventionally on sapphire or SiC then connecting the seed layer material to a host and removing the growth substrate would result in a composite substrate with a III-nitride seed layer with the nitrogen face exposed. III-nitrides preferentially grow on the gallium face, i.e. with the gallium face as the top surface, thus growth on the nitrogen face may undesirably introduce defects into the crystal, or result in poor quality material as the crystal orientation switches from an orientation with the nitrogen face as the top surface to an orientation with the gallium face as the top surface.

To form a composite substrate with a III-nitride seed layer with the gallium face as the top surface, seed layer material may be grown conventionally on a growth substrate, then bonded to any suitable intermediate substrate, then separated from the growth substrate, such that the seed layer material is bonded to the intermediate substrate through the gallium face, leaving the nitrogen face exposed by removal of the growth substrate. The nitrogen face of the seed layer material is then bonded to a host substrate 12, the host substrate of the composite substrate. After bonding to the host substrate, the intermediate substrate is removed by a technique appropriate to the growth substrate. In the final composite substrate, the nitrogen face of the seed layer material 16 is bonded to host substrate 12 through optional bonding layer 14, such that the gallium face of III-nitride seed layer 16 is exposed for growth of epitaxial device layers.

SUMMARY

It is an object of the invention to provide a composite substrate with a III-nitride seed layer.

In a method according to embodiments of the invention, a III-nitride layer is grown on a growth substrate. The III-nitride layer is connected to a host substrate. The growth substrate is removed. The growth substrate is a non-III-nitride material. The growth substrate has an in-plane lattice constant $a_{substrate}$. The III-nitride layer has a bulk lattice constant $a_{layer}$. In some embodiments, $[(|a_{substrate} - a_{layer}|)/a_{substrate}]*100\%$ is no more than 1%.

In some embodiments, since the seed layer is closely lattice matched to the growth substrate, trenches are not required to form a relaxed seed layer. In addition, in some embodiments the seed layer can be grown with the nitrogen face as the top surface, so two bonding steps are not required to form a composite substrate with the gallium face as the surface on which a device structure is grown. The composite substrates described herein may be used as growth substrates for III-nitride light emitting devices. III-nitride light emitting devices grown on composite substrates formed according to embodiments of the invention may have less strain in the light emitting region than conventionally grown III-nitride light emitting devices, and may therefore exhibit better performance than conventionally grown III-nitride light emitting devices.

DETAILED DESCRIPTION

Figure 1:
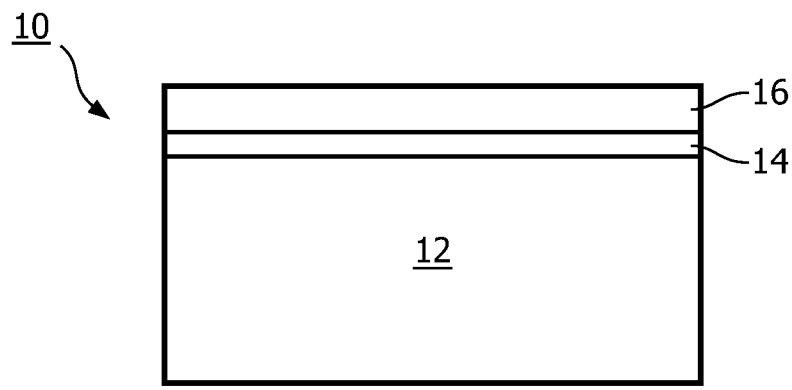
FIG. 1 illustrates a prior art composite substrate.

In the composite substrate illustrated in FIG. 1, when a strained III-nitride seed layer is released from the growth substrate and caused to relax, typically there is so much strain in the seed layer that a planar seed layer buckles. Trenches may be formed in the seed layer to divide the seed layer into islands smaller than the buckling wavelength. The islands relax without buckling, but forming the trenches requires additional processing steps. In addition, the step of growing a III-nitride structure on islands of seed layers requires either coalescing the III-nitride film over multiple islands, which is time consuming, or growing individual islands of III-nitride material, which reduces flexibility in device design.

In addition, bonding the seed layer twice, first to an intermediate substrate, then to the host substrate, in order to form a composite substrate where the III-nitride material is grown on the gallium face of the seed layer, requires additional processing steps and increases the likelihood of contamination of the seed layer, which may reduce yields or cause device failure.

In embodiments of the invention, a composite substrate includes a III-nitride seed layer attached to a host through an optional bonding layer. The seed layer is grown on a substrate which is lattice matched (or nearly so) to the desired III-nitride seed layer and of the same hexagonal symmetry as the III-nitride seed layer. Since the substrate is lattice matched, strain in the seed layer is reduced or eliminated, thereby improving the crystalline quality of the seed layer and any layers epitaxially deposited upon it. In some embodiments, the seed layer is grown on the substrate with the nitrogen face exposed, such that only one bonding step is required to form a composite substrate where a III-nitride structure may be grown on the gallium face of the seed layer.

Figure 2:
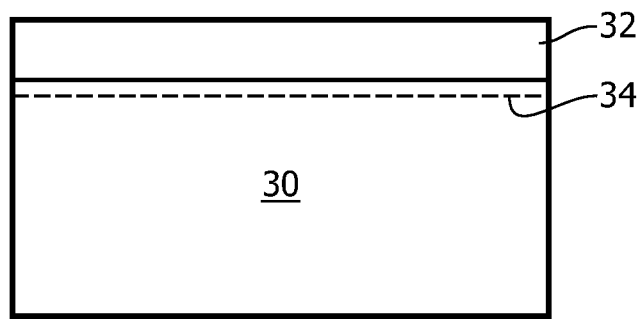
FIG. 2 illustrates a III-nitride seed layer grown on a substrate.

FIG. 2 illustrates a seed layer 32 grown on a growth substrate 30 according to embodiments of the invention. A semiconductor layer may be characterized by a bulk lattice constant and an in-plane lattice constant. The bulk lattice constant is the lattice constant of a theoretical, fully-relaxed layer of the same composition as the semiconductor layer. The in-plane lattice constant is the lattice constant of the semiconductor layer as grown. If the semiconductor layer is strained, the bulk lattice constant is different from the in-plane lattice constant. Growth substrate 30 may be a non-III-nitride material with an in-plane lattice constant within 1% of the bulk lattice constant of the deposited seed layer 32 in some embodiments, and within 0.5% of the bulk lattice constant of the deposited seed layer 32 in some embodiments. In other words, $[(|a_{substrate} - a_{seed}|)/a_{substrate}]*100\%$ is no more than 1% in some embodiments, and no more than 0.5% in some embodiments. For purposes of embodiments of the present invention, the bulk lattice constant of a ternary or quaternary AlInGaN layer may be estimated according to Vegard's law, which for $Al_xIn_yGa_zN$ may be expressed as $a_{AlInGaN} = x(a_{AlN}) + y(a_{InN}) + z(a_{GaN})$, where the variable "a" refers to the bulk a-lattice constant of each binary material and $x+y+z=1$. AlN has a bulk lattice constant of 3.111 Å, InN has a bulk lattice constant of 3.544 Å, and GaN has a bulk lattice constant of 3.1885 Å.

In some embodiments, growth substrate 30 has similar or the same hexagonal basal plane symmetry as the seed layer 32. In some embodiments, growth substrate 30 is substantially impervious to attack by the chemical and thermal environment experienced during the deposition of the seed layer 32. In some embodiments, growth substrate 30 has an in-plane coefficient of thermal expansion within 30% of that of the deposited seed layer 32. In some embodiments, growth substrate 30 may or may not be transparent to near-UV radiation. In some embodiments, growth substrate 30 is a single crystal or substantially single crystal material.

In some embodiments, growth substrate 30 is a material of general composition $RAO_3(MO)_n$, where R is a trivalent cation, often selected from Sc, In, Y, and the lanthanides (atomic number 57-71); A is also a trivalent cation, often selected from Fe (III), Ga, and Al; M is a divalent cation, often selected from Mg, Mn, Fe (II), Co, Cu, Zn and Cd; and n is an integer $\geq 1$. In some embodiments, $n \leq 9$ and in some embodiments, $n \leq 3$. In some embodiments, $RAMO_4$ (i.e., n=1) compounds are of the $YbFe_2O_4$ structure type, and $RAO_3(MO)_n$ ($n \geq 2$) compounds are of the $InFeO_3(ZnO)_n$ structure type.

Examples of suitable materials for growth substrate 30 and a lattice-matched InGaN seed layer 32 are listed below:

| Material | Lattice constant a (Å) | Appearance | y in lattice-matched $Al_xIn_yGa_{1-x-y}N$, x = 0 |
|---|---|---|---|
| $InFeZn_2O_5$ | 3.309 | Brown | 0.34 |
| $InFeZn_8O_{11}$ | 3.276 | Brown | 0.25 |
| $ScGaMgO_4$ | 3.272 | Transparent | 0.24 |
| $ScAlMgO_4$ | 3.236 | Transparent | 0.14 |
| $InAlMgO_4$ | 3.29 | Transparent | 0.29 |
| $ScAlMnO_4$ | 3.26 | Transparent | 0.20 |
| $InFeMnO_4$ | 3.356 | Brown | 0.48 |
| $InAlMnO_4$ | 3.319 | Black | 0.37 |
| $InAlCoO_4$ | 3.301 | Black | 0.32 |
| $InGaFeO_4$ | 3.313 | Black | 0.36 |

These and related substrate materials are described in detail by Kimizuka and Mohri in "Structural Classification of $RAO_3(MO)_n$ Compounds (R=Sc, In, Y, or Lanthanides; A=Fe(III), Ga, Cr, or Al; M=Divalent Cation; n=1-11)", published in Journal of Solid State Chemistry 78, 98 (1989), which is incorporated herein by reference.

In some embodiments, seed layer 32 is grown on a surface of growth substrate 30 that is "miscut" or angled relative to a major crystallographic plane of the substrate. In some embodiments, the surface of growth substrate 30 on which seed layer 32 is grown may be oriented between −10 and +10 degrees away from the basal (0001) plane. In some embodiments, miscuts between −0.15 and +0.15 degrees tilted from the (0001) plane may result in large atomic terraces on the substrate surface that may desirably reduce the number of defects formed at terrace edges.

Seed layer 32 may be deposited on growth substrate 30 by any of the means known in the art, including, for example, MOCVD, hydride vapor phase epitaxy (HYPE), or MBE. Perfect lattice matching between the seed layer 32 and the growth substrate 30 is not necessary, although a lattice match within 0.1% may permit the deposition of high-quality seed layers 32 at least 50 μm thick. Seed layer 32 may have a thickness between 100 nm and 5 μm in some embodiments, and between 100 nm and 500 nm in some embodiments.

Seed layer 32 is grown on substrate 30 such that the nitrogen-face of the seed layer is the growth surface and the gallium-face of the seed layer is adjacent the substrate 30 surface. The surface of substrate 30 may be treated prior to deposition of the seed layer, for example to improve the surface or for any other purpose, for example by exposing the substrate for two minutes to a gaseous mixture of $NH_3$ and $N_2$ in a ration of 2:1 at a temperature of 900° C. and a pressure of 200 mbar.

Seed layer 32 may be any material on which a III-nitride device structure may be grown. Seed layer 32 is often a ternary (such as InGaN or AlGaN) or quaternary (such as AlInGaN) alloy of III-nitride or other III-V material. The fraction of InN in an InGaN seed layer 32 may be between 6% and 48% in some embodiments. The $Al_xIn_yGa_zN$ alloy with x~0 has a range of energy gaps which produce light across the entire visible radiation spectrum. Consequently all of the possible alloy compositions can be useful in light-emitting devices such as LEDs.

In some embodiments, a zone of weakness 34 is disposed within the growth substrate 30 or at the substrate/seed layer interface. The zone of weakness may be provided before or after the growth of the seed layer. In some embodiments, zone of weakness 34 is formed by implanting H or N, alone or in combination with other ions, in sufficient concentration such that, upon application of heat, the ions will form microcavities within the growth substrate 30. For example, H may be implanted with a dose of $10^{17}$ $cm^{-2}$ with an accelerating voltage of 120 keV. In some embodiments, a zone of weakness 34 is formed by exposing the wafer with a pattern of tightly focused, pulsed laser beams of sufficient intensity and photon energy to create a plurality of micron-scale crystal defects or voids in the crystalline structure. The pattern of crystal damage may be generated by rastering one or more laser beams across the wafer or the use of diffractive optics to generate a large number of spots from a single high power laser such as an excimer laser. The laser beams may be strongly converging with a short sub-microsecond pulse, and may create highly localized damage.

Figure 3:
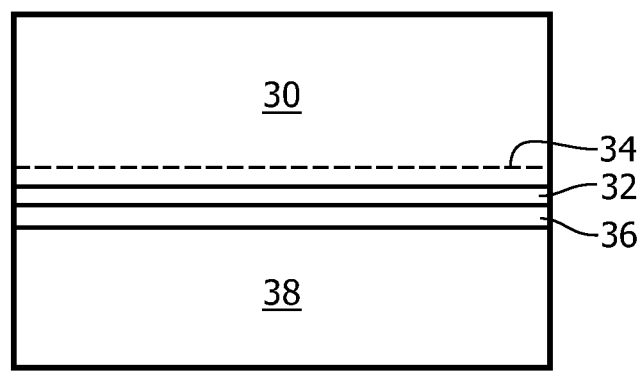
FIG. 3 illustrates a III-nitride seed layer bonded to a host substrate.

As illustrated in FIG. 3, a bonding layer 36 may be provided by depositing a film of $SiO_x$, $SiO_2$, or $SiN_x$ on the seed layer 32 by any of the means known in the art such as plasma-enhanced chemical vapor deposition (PECVD) or low-pressure chemical vapor deposition (LPCVD). The $SiO_2$ film may have a thickness of 10 nm to 10 µm in some embodiments and 200 nm to 1 µm in some embodiments. The $SiO_2$ film may optionally be planarized by chemo-mechanical polishing with, for example, a slurry of colloidal silica.

Seed layer 32 is bonded to a host substrate 38 through bonding layer 36, for example by pressing the growth substrate 30 and host substrate 38 together at elevated temperature and/or pressure. Host substrate 38 may be any suitable material, including but not limited to single crystal or polycrystalline sapphire, sintered AlN, Si, SiC, GaAs, single crystal or ceramic $Y_3Al_5O_{12}$, which may or may not be doped with activating dopants such as Ce such that it is wavelength converting, and metals such as Mo.

Figure 4:
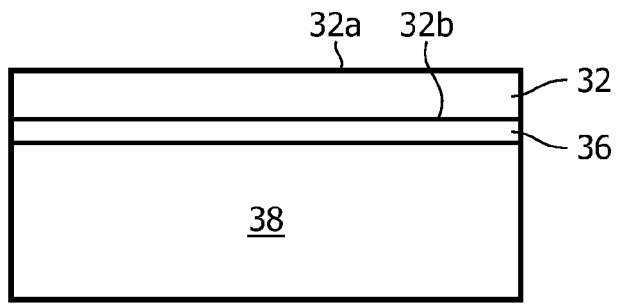
FIG. 4 illustrates a composite substrate including a III-nitride seed layer.

As illustrated in FIG. 4, the substrate is removed from seed layer 32 by any suitable method. In structures including a zone of weakness, the growth substrate 30 may be removed at the zone of weakness, for example by heating to activate the implanted layer described above. In some embodiments, a structure including a zone of weakness of implanted H atoms is heated to a temperature of 600° C. (the temperature may be higher or lower, depending on the implant species and dose), whereupon the H atoms collect into microcavities which cause the zone of weakness to mechanically fracture. An advantage of providing a zone of weakness 34 to remove the growth substrate 30 from seed layer 32 is that the remaining portion of the substrate may be polished and used again as a growth substrate.

Other methods of removing growth substrate 30 include mechanical methods such as mechanical grinding, applying a rotational force between the substrate and the seed layer, attaching an adhesive-coated plastic film to the substrate and a second adhesive-coated plastic film to the structure including the seed layer and pulling the substrate and seed layer apart, using a sharp blade to break the interface between the substrate and the seed layer, using a pulse of sonic energy or inhomogeneous temperature distribution to break the interface between the substrate and the seed layer, applying one or more laser pulses focused to a small point (<1 $mm^2$) at the interfacial plane creating a shockwave that initiates fracture, and applying a temperature gradient across the surface normal of the seed layer and substrate (for example, higher temperature applied to one face of the seed layer, and lower temperature applied to one face of the substrate), such that the thermally induced stress in the plane of the seed layer/substrate interface is sufficient to cause fracture of that interface.

In some embodiments, growth substrate 30 is transparent, allowing seed layer 32 to be removed by laser lift-off, where a laser beam is directed through the substrate. The layer of III-nitride material grown first on growth substrate 30 absorbs the laser light and melts, releasing seed layer 32 from the substrate. Laser lift-off may be facilitated by an optional layer of narrower-energy-gap alloy semiconductor interposing the seed layer 32 and the growth substrate 30. The composition of the narrower-energy-gap layer may be selected such that it absorbs more of the incident laser light than the seed layer 32, which may reduce the incident flux required and producing less distributed damage throughout the seed layer 32.

In some embodiments, all or a part of growth substrate 30, such as a portion of growth substrate 30 remaining after activating an implanted layer to detach the substrate from the seed layer, is removed by etching, such as wet chemical etching. For example, $ScMgAlO_4$ is readily attacked by aqueous mixtures of $H_3PO_4$ and $H_2O_2$, $H_2SO_4:H_2O_2:H_2O$, and aqueous mixtures of HF, as reported by C. D. Brandle, et al. in "Dry and Wet Etching of $ScMgAlO_4$" published in Solid-State Electronics, 42, 467 (1998), which is incorporated herein by reference. In some embodiments, all or part of growth substrate 30 is removed by reactive ion etching using a gaseous mixture of $Cl_2$ and Ar at an applied power of 800 Watts.

In some embodiments, seed layer 32 is bonded to host substrate 38 through bonding layer 36 such that the group III or gallium face of the wurtzite crystal is the top surface 32a of seed layer 32, the surface available for growing III-nitride or other semiconductor material. The group V or nitrogen face of the wurtzite crystal is the bottom surface 32b of seed layer, the surface adjacent to bonding layer 36.

Figure 5:
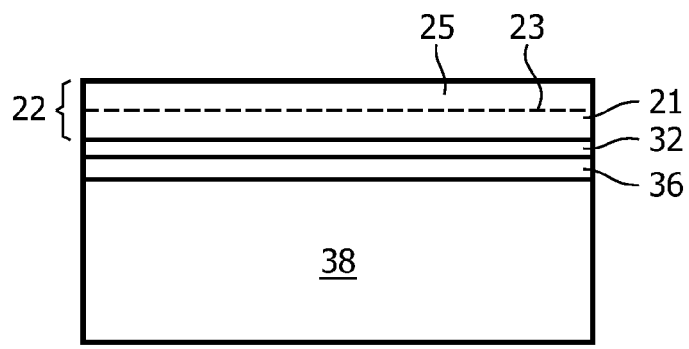
FIG. 5 illustrates a III-nitride device structure grown on the composite substrate of FIG. 4.

A semiconductor device structure 22 may be grown on seed layer 32 of the composite substrate, as illustrated in FIG. 5. Though in the examples below the semiconductor device structure is a III-nitride LED that emits visible or UV light other device such as electronic and optoelectronic devices such as laser diodes, high electron mobility transistors, and heterojunction bipolar transistors may be formed on the substrates described herein.

As illustrated in FIG. 5, a semiconductor structure 22 is grown over seed layer 32. The semiconductor structure 22 includes a light emitting or active region 23 sandwiched between n- and p-type regions 21 and 25. An n-type region 21 is typically grown first and may include multiple layers of different compositions and dopant concentration including, for example, preparation layers such as buffer layers or nucleation layers, which may be n-type or not intentionally doped, and n- or even p-type device layers designed for particular optical or electrical properties desirable for the light emitting region to efficiently emit light. The n-type region 21 is between 1 and 20 µm thick in some embodiments and between 1 and 5 µm thick in some embodiments. A light emitting or active region 23 is grown over the n-type region 21. Examples of suitable light emitting regions 23 include a single thick or thin light emitting layer, or a multiple quantum well light emitting region including multiple thin or thick light emitting layers separated by bather layers. The active region 23 is between 1 nm and 5 µm thick in some embodiments, between 2 nm and 1 µm thick in some embodiments, and between 5 nm and 100 nm thick in some embodiments. A p-type region 25 is grown over the light emitting region 23. Like the n-type region 21, the p-type region 25 may include multiple layers of different composition, thickness, and dopant concentration, including layers that are not intentionally doped, or n-type layers. The p-type region 25 is between 100 nm and 2 µm thick in some embodiments and between 20 nm and 400 nm thick in some embodiments.

In some embodiments, the light emitting layer or layers in the light emitting region 23 have a composition that is nearly lattice matched to the seed layer (which is in turn lattice-matched to the growth substrate 30). Strain in a light emitting layer is defined as $[(|a_{bulk}-a_{in\text{-}plane}|)/a_{bulk}]*100\%$, where $a_{bulk}$ is the lattice constant of a layer of the same composition as the light emitting layer when fully relaxed, which is estimated according to Vegard's law, and $a_{in\text{-}plane}$ is the lattice constant of the light emitting layer as grown in the device. Strain in at least one of the light emitting layers is less than 1% in some embodiments, less than 0.5% in some embodiments, and less than 0.1% in some embodiments. In one embodiment, $ScMgAlO_4$ is the growth substrate 30 and the n-type, light-emitting, and p-type layers are formed of $In_{0.13}Ga_{0.87}N$, $In_{0.16}Ga_{0.84}N$, and $In_{0.12}Ga_{0.88}N$ respectively. The seed layer is the same composition as the n-type region, $In_{0.13}Ga_{0.87}N$.

Figure 6:
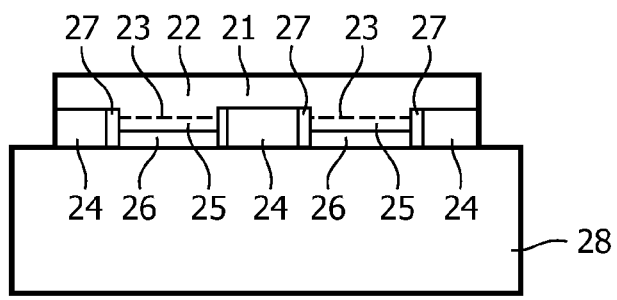
FIG. 6 illustrates a thin film flip chip light emitting device.
Figure 7:
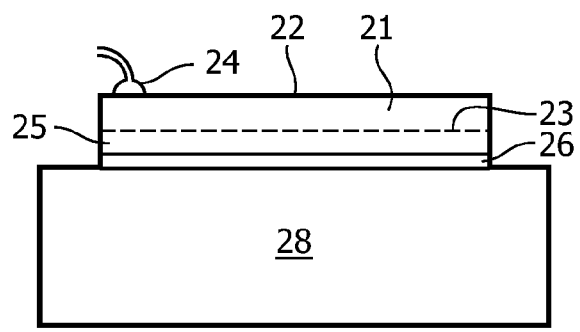
FIG. 7 illustrates a vertical light emitting device.

The structure illustrated in FIG. 5 may be processed into any suitable device design, including but not limited to the thin film flip chip device illustrated in FIG. 6 and the vertical device illustrated in FIG. 7.

In the device illustrated in FIG. 6, p-contact metal 26 is disposed on the p-type region 25, then portions of the p-type region 25 and active region 23 are etched away to expose an n-type layer for metallization. The p-contacts 26 and n-contacts 24 are on the same side of the device. P-contacts 26 are electrically isolated from n-contacts 24 by gaps 27, which may be filled with an electrically insulating material such as a dielectric. As illustrated in FIG. 6, p-contacts 26 may be disposed between multiple n-contact regions 24, though this is not necessary. In some embodiments either or both the n-contact 24 and the p-contact 26 are reflective and the device is mounted such that light is extracted through the top of the device in the orientation illustrated in FIG. 6. In some embodiments, the contacts may be limited in extent or made transparent, and the device may be mounted such that light is extracted through the surface on which the contacts are formed. The semiconductor structure is attached to a mount 28. All or part of the composite substrate on which semiconductor structure 22 is grown may be removed, as illustrated in FIG. 3, or may remain part of the device. For example, host substrate 38 and bonding layer 36 may be removed, and seed layer 32 may remain part of the device. In some embodiments, the semiconductor layer exposed by removing all or part of the composite substrate is patterned or roughened, which may improve light extraction from the device.

In the vertical injection LED illustrated in FIG. 7, an n-contact is formed on one side of the semiconductor structure 22, and a p-contact is formed on the other side of the semiconductor structure. For example, the p-contact 26 may be formed on the p-type region 25 and the device may be attached to mount 28 through p-contact 26. All or a portion of the composite substrate may be removed and an n-contact 24 may be formed on a surface of the n-type region 21 exposed by removing all or a portion of the composite substrate. Electrical contact to the n-contact may be made with a wire bond as illustrated in FIG. 7 or a metal bridge.

The LED may be combined with one or more wavelength converting materials such as phosphors, quantum dots, or dyes to create white light or monochromatic light of other colors. All or only a portion of the light emitted by the LED may be converted by the wavelength converting materials. Unconverted light emitted by the LED may be part of the final spectrum of light, though it need not be. Examples of common combinations include a blue-emitting LED combined with a yellow-emitting phosphor, a blue-emitting LED combined with green- and red-emitting phosphors, a UV-emitting LED combined with blue- and yellow-emitting phosphors, and a UV-emitting LED combined with blue-, green-, and red-emitting phosphors. Wavelength converting materials emitting other colors of light may be added to tailor the spectrum of light emitted from the device.

The wavelength converting element may be, for example, a pre-formed ceramic phosphor layer that is glued or bonded to the LED or spaced apart from the LED, or a powder phosphor or quantum dots disposed in an organic encapsulant that is stenciled, screen printed, sprayed, sedimented, evaporated, sputtered, or otherwise dispensed over the LED.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A method comprising:
    growing a III-nitride layer on a growth substrate; wherein
        the growth substrate is a non-III-nitride material;
        the growth substrate has an in-plane lattice constant $a_{substrate}$;
        the III-nitride layer has a bulk lattice constant $a_{layer}$; and
        $[(|a_{substrate}-a_{layer}|)/a_{substrate}]*100\%$ is no more than 1%;
    connecting the III-nitride layer to a host substrate; and
    removing the growth substrate,
    wherein growing a III-nitride layer on a growth substrate comprises growing the III-nitride layer such that a group V face of the III-nitride layer is proximate the host substrate and a group III face of the III-nitride layer is opposite the host substrate.

2. The method of claim 1 wherein the growth substrate is $ScAlMgO_4$ and the III-nitride layer is InGaN.

3. The method of claim 1 wherein the growth substrate is $RAO_3(MO)_n$, where R is selected from Sc, In, Y, and the lanthanides; A is selected from Fe (III), Ga, and Al; M is selected from Mg, Mn, Fe (II), Co, Cu, Zn and Cd; and n is an integer ≥1.

4. The method of claim 1 wherein the III-nitride layer is one of InGaN and AlInGaN.

5. The method of claim 1 wherein the III-nitride layer is $In_xGa_{1-x}N$, where $0.06 \leq x \leq 0.48$.

6. The method of claim 1 wherein connecting comprises bonding through a bonding layer disposed between the III-nitride layer and the host substrate.

7. The method of claim 6 wherein the bonding layer is one of a non-III-nitride material, $SiO_x$, and $SiN_x$.

8. The method of claim 6 wherein:
the III-nitride layer is InGaN;
the bonding layer is $SiO_x$; and
the host substrate is sapphire.

9. The method of claim 1 further comprising growing on the III-nitride layer a structure comprising a III-nitride light emitting layer disposed between an n-type region and a p-type region.

10. The method of claim 9 further comprising removing the host substrate after growing a structure comprising a III-nitride light emitting layer disposed between an n-type region and a p-type region.

11. The method of claim 1 further comprising forming a zone of weakness in the growth substrate or at an interface between the growth substrate and the III-nitride layer, wherein removing the growth substrate comprises separating the III-nitride layer from the growth substrate at the zone of weakness.

12. The method of claim 11 wherein the zone of weakness comprises a region implanted with one of H atoms and N atoms.

13. The method of claim 11 wherein the zone of weakness comprises a plurality of micron scale crystal defects or voids created by irradiation with focused laser beams.

14. The method of claim 1 wherein the host substrate is sapphire.

15. The method of claim 1 wherein the III-nitride layer is grown on a surface of the growth substrate that is misoriented from a (0001) plane of the growth substrate by between −10 and 10 degrees.

16. The method of claim 1 wherein removing comprises removing by a mechanical method.

17. The method of claim 1 wherein removing comprises breaking an interface between the growth substrate and the III-nitride layer with a blade.

18. The method of claim 1 wherein removing comprises one of mechanical grinding, applying a rotational force between the growth substrate and the III-nitride layer, attaching a first adhesive-coated plastic film to the growth substrate and a second adhesive-coated plastic film to a semiconductor structure including the III-nitride layer and pulling the growth substrate and III-nitride layer apart, using one of a pulse of sonic energy and an inhomogeneous temperature distribution to break an interface between the growth substrate and the III-nitride layer, and applying a temperature gradient across a surface normal of the III-nitride layer and growth substrate such that thermally induced stress in a plane of the III-nitride layer/growth substrate interface is sufficient to cause fracture of that interface.

* * * * *